United States Patent [19]
Kelly et al.

[11] Patent Number: 5,294,257
[45] Date of Patent: Mar. 15, 1994

[54] EDGE MASKING SPIN TOOL

[75] Inventors: Howard L. Kelly, Warrenton, Va.; Hans-George H. Kolan, Boca Raton, Fla.; James M. Leas, Burlington, Vt.; Teruhiro Nakasogi, Shiga, Japan

[73] Assignee: International Business Machines Corporation, Armonk, N.Y.

[21] Appl. No.: 783,753

[22] Filed: Oct. 28, 1991

[51] Int. Cl.$^5$ ............................................. B05C 11/02
[52] U.S. Cl. ...................... 118/52; 118/409; 118/416; 118/503; 118/504; 118/505
[58] Field of Search ................. 118/52, 504, 505, 503, 118/409, 416

[56] References Cited

U.S. PATENT DOCUMENTS

| | | | |
|---|---|---|---|
| 2,899,339 | 8/1959 | Rakus | 117/102 |
| 4,068,019 | 1/1978 | Boeckl | 427/82 |
| 4,086,870 | 5/1978 | Canavello et al. | 118/52 |
| 4,111,698 | 9/1978 | Sato | 96/79 |
| 4,113,492 | 9/1978 | Sato et al. | 96/67 |
| 4,668,334 | 5/1987 | Doornveld | 156/640 |
| 4,732,785 | 3/1988 | Brewer | 427/240 |
| 4,748,053 | 5/1988 | Okada | 427/240 |
| 4,822,639 | 4/1989 | Fujii et al. | 427/240 |

FOREIGN PATENT DOCUMENTS

| | | |
|---|---|---|
| 53-76747 | 7/1978 | Japan . |
| 59-15444 | 9/1984 | Japan . |
| 60-266125 | 11/1985 | Japan . |

OTHER PUBLICATIONS

IBM TDB "Rheology Control of Films Deposited By Spin Technique" by Esch, et al, vol. 16, No. 6.
IBM TDB "Method for Producing Uniform Controlled Thin Films" by Caracciolo, vol. 3, No. 1.
IBM TDB "Wafer Back Side Periphery for Simultaneous Processing" by Raacke et al, vol. 16, No. 6.
IBM TDB "Spin Coating Edge Build-up Elimination" by Decker et al, vol. 20, No. 10.
IBM TDB "Controlled Gap Photoresist Spinning Process" by Holihan, et al, vol. 17, No. 11.

*Primary Examiner*—Bernard Pianalto
*Attorney, Agent, or Firm*—Jeffrey S. LaBaw; Joseph C. Redmond, Jr.

[57] ABSTRACT

An apparatus and method for spin coating a substrate with a liquid material which prevents the material from contacting the edge or backside of the substrate or forming an edge bead at the periphery of the substrate is disclosed. A spin chuck is equipped with a conformable elastomer which seals the edge of the substrate and forms a continuous surface with a planar surface of the substrate for the liquid material to flow off the substrate unimpeded during the spin coating process. As the elastomer is resilient, small variations in substrate size and shape are automatically compensated. None of the substrate area is lost to masking and/or removal processes as in the prior art, allowing the entire substrate area to be available for further processing.

7 Claims, 4 Drawing Sheets

EDGE MASKING SPIN TOOL

BACKGROUND OF THE INVENTION

This invention generally relates to the spin application of photoresist, polyimide, and other liquid materials. More particularly, it relates to an apparatus and method for spin applying the liquid materials to a planar top surface of an electronic substrate so that the edge and back of the substrate are not coated with the material.

Liquid coating materials such as photoresist and polyimide are most often applied to electronic substrates such as semiconducting wafers, chip-carrying substrates, and printed circuit boards by methods including spin, spray, and dip. These materials are used for a variety of purposes including photolithography, mask layers and electrical insulators. A spin application is preferred for these materials in semiconductor processing because it generally provides a thin, uniform coating.

However, there are at least two major problems encountered during spin apply process. The first problem is that a thick layer of material known as an edge bead usually forms near the substrate edge. The edge bead is the result of surface tension within the film that draws the material in from the substrate edge. Because the thickened material does not cure as fully as the thinner coating on the rest of the surface, it degrades during further processing and is a source of particulate contamination. If the thicker material is photoresist, lithography processing is generally impossible in this area. The edge bead is therefore a concern for integrated circuits and high density substrates. For semiconductor wafers, this excess thickness of resist at the edge of the wafer is responsible for a higher defect level at the wafer edge, lower yield, and lower reliability for chips located near the edge of the wafer.

The second problem is that the coating material often wets the wafer edge and creeps around to the back of the wafer during the spinning. Material in these locations is also a source of particulate contamination. Photoresist on the wafer back can prevent proper leveling and focusing of the lithography tool during a subsequent photoexposure step.

Thus, in conventional processing, the edge bead and the material on a wafer edge and back must be removed before further processing. Typically, the removal is accomplished by a chemical spray directed at the wafer before the resist is baked. However, it is known that resist dissolving chemicals cause bulging of the resist adjacent to the removed resist. This degraded resist is also a source of particulate contamination, especially if the wafer is subjected to an ultraviolet hardening step. For this reason, an additional segment of edge resist, that exposed to the resist removing chemical, must also be removed. This additional segment of resist is removed by exposing and developing the edge region. The two removal steps cause 1 to 2 mm of resist to be lost from for the outer edge of the top surface of the wafer.

U.S. Pat. No. 4,086,870 describes an edge masking technique using a knife edge cover plate mask which prevents resist from coating an outer ring of the wafer. As resist is usually much thinner than a knife edge, the knife edge appears as a wall impeding the free flow of material off the spinning wafer, causing non-uniformity in thickness and splashes of particles which land back on the wafer. Furthermore, capillary action forces resist under the knife edge cover plate allowing the resist to wet the wafer edge and back. Variations in wafer thickness and irregularities in the wafer surface or in the thin knife edge surface provide gaps, increasing the amount of leaking under the mask. Also, the top cover plate covers part of the active area of the wafer. The loss of semiconductor real estate due to the knife edge becomes more important as the industry moves to larger wafer sizes, thus losing a greater number of potential chip sites at the edge of the wafer. Finally, the complicated mechanism makes automation difficult.

SUMMARY OF THE INVENTION

It is therefore an object of the present invention to eliminate edge bead on a substrate during coating of a planar substrate with a liquid material in a spin apply process.

It is another object of the invention to avoid interference with material flowing off the substrate during spinning.

It is another object of the invention to seal the edge and back of a substrate from contact with the liquid coating material, accommodating variations in substrate size and shape.

It is a further object of the invention to allow automatic placement and removal of substrates on an apparatus designed according to the present invention.

It is another object of the invention to coat the entire top surface of the substrate without reducing the coated area with the means used to accomplish the other objects of the invention.

These and other objects of the invention are accomplished by using a rotating chuck having a conformal elastomer, the elastomer positioned to surround the periphery of the substrate when placed on the chuck for the spin coating process. In the preferred embodiment, the elastomer is an inflatable elastomer in the shape of an O-ring or D-ring in the approximate shape of the substrate to be coated. When inflated, the elastomer makes a sealing contact and masks the substrate edge.

The inflatable elastomer provides a pressurized seal to the substrate, eliminating the concern about capillary action leaks to the edges or backside of the substrate. Since pressure is equally applied to all points on the substrate edge, defects or small variations in substrate size and shape are automatically accommodated. The elastomer masks only the edge of the substrate, so the liquid material covers the full substrate surface to the edge of the substrate. Thus, the full surface can be used for electronic devices and more devices can be built on each substrate.

Once the substrate is in position for spin coating, the top surface of the elastomer forms a substantially continuous surface with the top surface of the substrate and is also substantially planar to the top surface of the substrate. As the seal does not extend above the substrate surface, the flow of resist off the substrate is not impeded by the elastomer. Thus, resist uniformity is not degraded. Edge beading is eliminated since the resist film smoothly crosses the substrate-elastomer boundary. The surface tension force pulling in the resist is transferred from the substrate edge to the outside edge of the elastomer or the outside edge of a frame. As the elastomer is substantially planar to the substrate, there is also no wall against which resist thickness would build up. The structure is low cost and simple compared to the prior art. No springs, clamps, top cover plates, or knife edges are needed.

While the continuous surface provided at the substrate periphery transfers much of the edge bead effect to the outer edge of the spin chuck, a small edge bead can form with remaining material on the substrate. To prevent this, the substrate is given a few seconds of extended spin to remove sufficient solvent to prevent an edge bead from forming after the elastomer is deflated and removed.

In another embodiment of the invention, the substrate is forced into a firm elastomeric ring which conforms to and seals the substrate edge. The force is provided by vacuum pressure. In yet another embodiment of the invention, the natural position of a hollow O-ring or D-ring of elastomer is conformal to the periphery of the substrate. A vacuum is applied to deflate the elastomer ring to allow the substrate to be placed in or removed from the coating apparatus.

BRIEF DESCRIPTION OF THE DRAWINGS

The accompanying drawings illustrate embodiments of the invention and together with the description serve to explain the principles of the invention.

DETAILED DESCRIPTION OF THE DRAWINGS

Figure 1A:
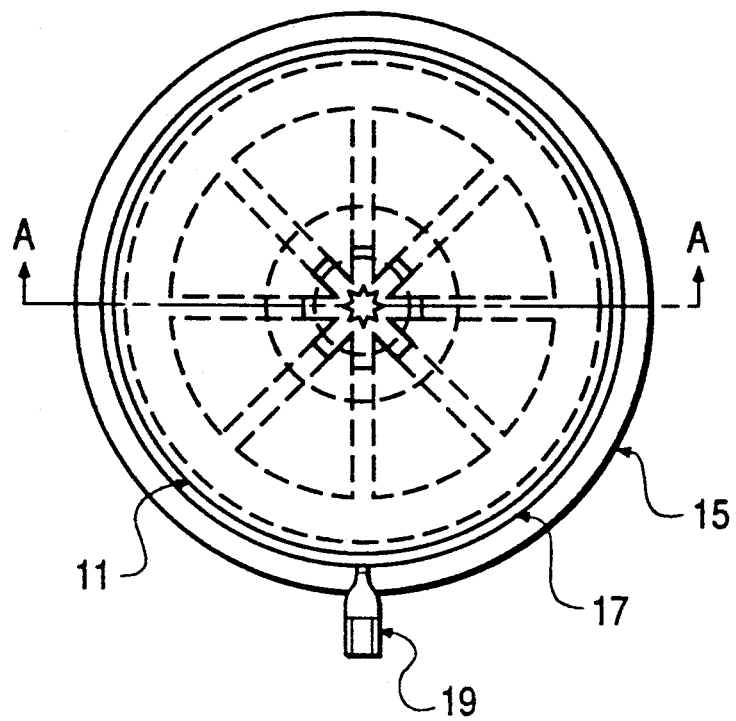
FIGS. 1A and 1B are top and cross sectional views of a spinner chuck built according to a first embodiment of the invention using an inflatable elastomer ring sealed to the edge of a wafer.
Figure 1B:
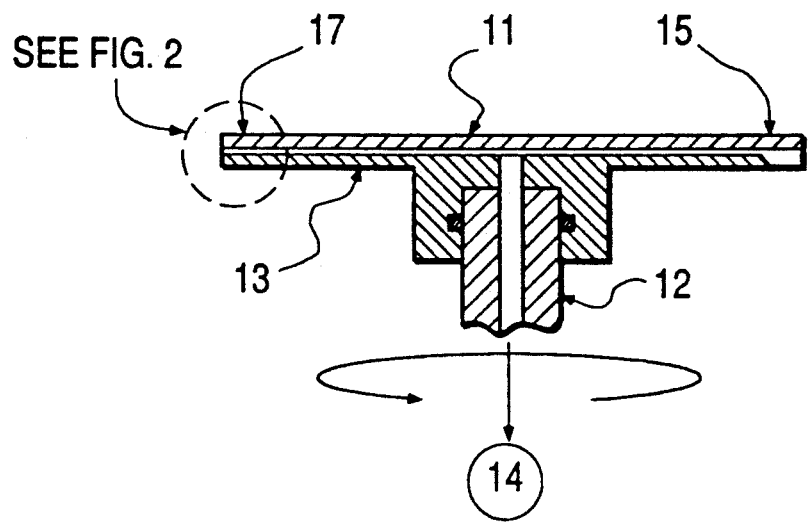
Figure 2:
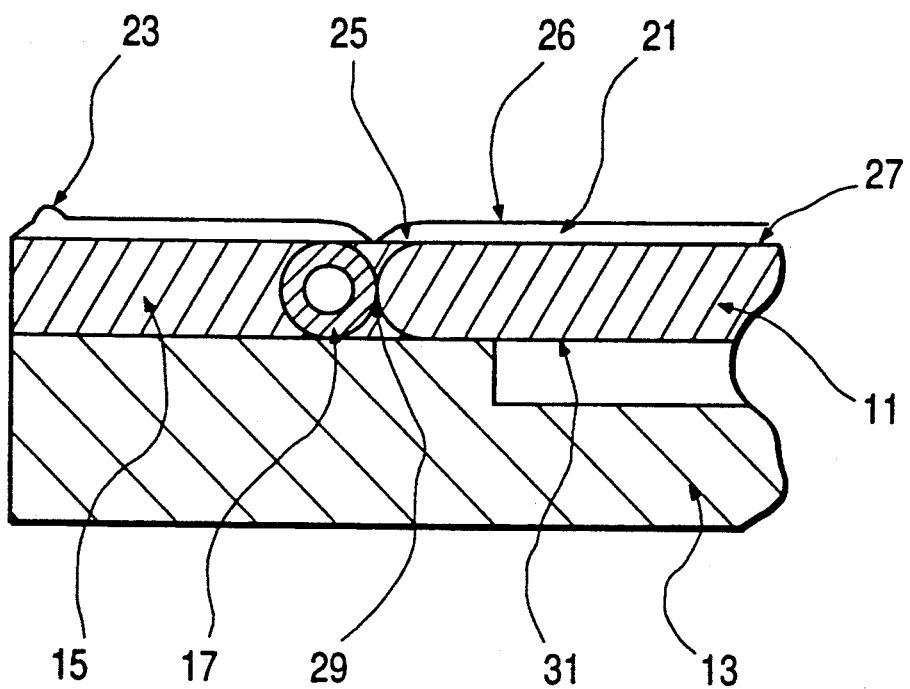
FIG. 2 is an enlarged cross-sectional view of the edge of silicon wafer and inflatable elastomer ring mounted on the spinner chuck depicted in FIG. 1.

Referring to FIGS. 1 and 2, a substrate 11 is mounted on a vacuum chuck 13 to which is also fixed a frame 15 of a height substantially planar with the top surface of the substrate. In FIGS. 1A and 1B, the chuck 13 is mated to a sealed shaft 12 which is made to spin upon command from a spinner tool (not shown). The chuck 13 and frame 15 support an inflatable elastomer 17 which is inflated to make a pressurized sealing contact with the edge of the substrate 11. The elastomer is an elastic, rubber-like substance and can be as natural or synthetic rubber or other similar elastic materials. Rubbers, elastic plastics, nitriles and fluorocarbons of sufficient durability and solvent resistance may be used with the present invention. The substrate 11 is held in place by a vacuum supplied by vacuum line 14. The elastomer is inflated by forcing in air or a fluid through a connecting valve 19, much like a bicycle tire with a removable supply line (not shown). More complicated schemes for supplying the inflating pressure to the elastomer 17 would occur to one skilled in the art such as supply lines provided in the chuck 13. The height of the inflated elastomer is substantially planar to the top surface of the substrate to form a substantially continuous surface to avoid the possibility of impeding the flow of resist, polyimide, or other liquid coating material off the substrate as the substrate 11 spins. Thus, if the substrate is a semiconducting wafer, with a thickness of about 20 mils, the inflated elastomer has a cross sectional diameter of approximately 20 mils. If the substrate is a chip carrier, with a thickness of 75 to 250 mils, the inflated elastomer will have a correspondingly larger cross sectional diameter. While one skilled in the art would understand that a variety of liquid coating materials can be used in the present invention, the detailed description will refer to the coating material as resist or photoresist.

In FIG. 2, resist 21 has been spin coated on the substrate 11, and the resist has spun out onto the elastomer 17 and frame 15. Typical thicknesses for resist and other materials range from 0.5 to 10 um. The curves between substrate and frame are reasonably smooth, so the resist 21 forms a continuous film connecting substrate 11, elastomer 17, and frame 15. Surface tension forces allow an edge bead 23 of thick photoresist to form only on the outer edge of the frame 15 where there is a discontinuity in the resist, and that is far from the substrate edge 25. The edge bead is generally 1 to 5 um thicker than the rest of the resist. Thus, the surface tension force that normally causes thicker photoresist on the substrate edge is transferred from the edge of the substrate to the outer edge of the frame, where it is inconsequential for substrate yield or reliability.

The resist 21 on the substrate 11 is found to be uniform across its entire surface 26 and past the edge of the surface where it curves down to form the top of the edge of the substrate 25. Because of the sealing by the pressurized elastomer 17, an extended region along the vertical edge 29 and back side 31 of the substrate 11 is free of resist. Experimental results have shown that the resist 21 maintains a continuous film and is able to bridge a small gap between a wafer 11 and a surrounding ring 17. Pressure sealing is not needed to maintain the continuous film from substrate 11 to ring 17, but only to prevent resist 21 from wetting the substrate edge 29 and back 31.

The elastomer 17 may have several cross sectional shapes including O-ring and D-ring, with one side attached to the frame 15 as shown in FIG. 2. While much of the edge bead effect is transferred to the elastomer 17 or frame 15, a smaller edge bead can form on the substrate 11 if the spin is prematurely stopped. The resist 21 must be relatively immobile before the elastomer 17 is deflated so surface tension will not then be able to pull resist 21 away from the edge of the substrate 11, causing an edge bead. However, the resist 21 must not be cured so hard that it flakes into particles when the elastomer 17 is deflated. One way to remove solvents is by extending the spinning of the substrate 11 until the resist 21 is immobile, just past tacky. Another method to prevent edge bead would be to heat the wafer slightly after the chuck stops. Using heating, the extended spin is not necessary to set the resist before the O-ring is separated from the substrate.

In processing substrates, first the substrate 11 is inserted in the fixture 13, held by vacuum provided by vacuum line 14, then the nearby elastomer 17 is inflated so that it seals against the substrate edge 29. The inflated elastomer 17 will conform to small variations in substrate size and shape, provide sealed masking, and provide an easily removable structure as compared with a rigid overhang. Resist 21 is applied using standard application procedures. The elastomer 17 masks the substrate edge 29 without extending above the surface of the substrate, so it does not restrict the flow of photoresist off the substrate during the apply and spin steps. The elastomer 17 is then removed by deflating it slightly. The substrate 11 is removed. The elastomer 17 is spray cleaned and spun dry.

The elastomer 17 must be able to stand up to solvent spray. A perfluoro elastomer such as Kalrez ™, coating an elastomer tubing will withstand most solvents, including N-butyl acetate and cellosolve acetate. A preferred elastomer ring 17 is a Kalrez ™ coated-Viton ™ inflatable O-ring. Viton is a fluoroelastomer, and other elastomers may be used as the body of the O-ring. As Teflon ™ a fluoropolymer withstands most solvents, it is a possible coating for the O-ring. However, as Teflon is not an elastomer, Kalrez is preferred. Kalrez, Vitron and Teflon are trademarks of the DuPont Corporation. An alternate cleaning method is to expose resist on the elastomer to light and then spray a developer. In this case, a broader range of elastomers can be used, but in addition to the light exposure and developer spray, it is also necessary to rinse the elastomer with deionized water to remove developer before the next wafer is inserted.

Figure 3A:
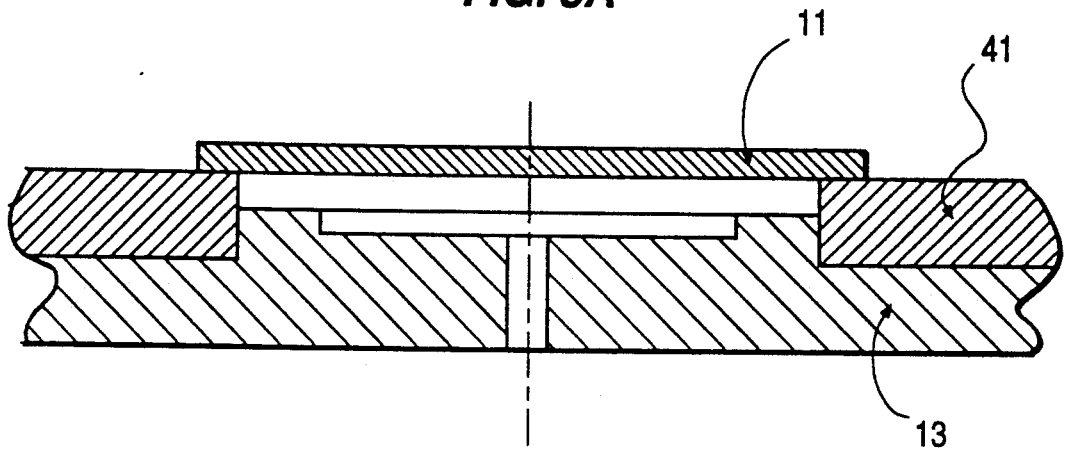
FIGS. 3A and 3B are cross-sectional views of a silicon wafer mounted on an elastomer ring and whose edge is embedded in the elastomer by the force of vacuum pulling down on the substrate.
Figure 3B:
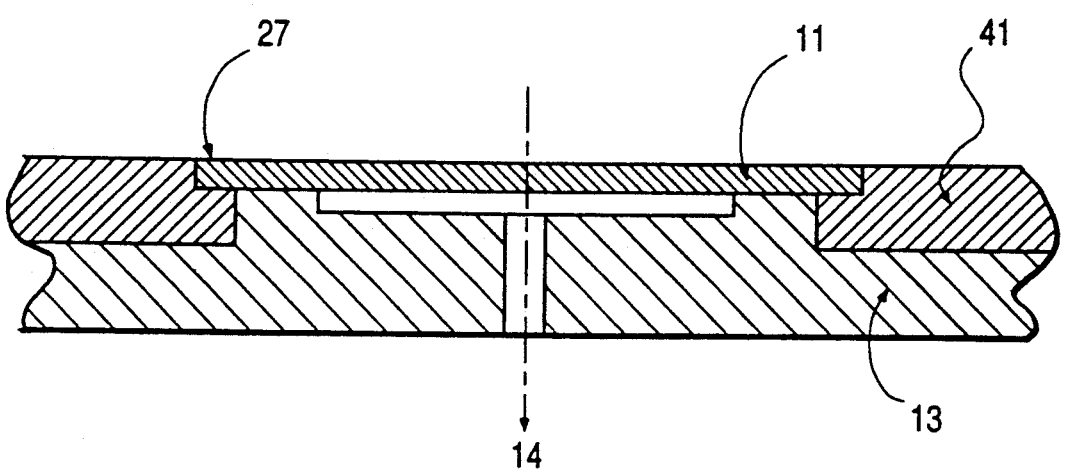

Another embodiment of the invention is illustrated in FIGS. 3A and 3B in which the edge seal is obtained by pulling the substrate 11 down with a vacuum force into a resilient elastomer ring 41 located along the substrate edge. FIG. 3A illustrates the substrate and apparatus before vacuum is applied, and FIG. 2B illustrates after vacuum is applied. In FIG. 2A, the substrate 11 is resting on a ring of elastomer 41 above the vacuum chuck 13. In FIG. 2B, vacuum has been applied, and the substrate 11 has been pulled down to the surface of the chuck 13, embedding the substrate edge 11 in the elastomer 41. Because of the compression of the elastomer 41, there is a sealing force directed at the substrate edge 11. The elastomer 41 is selected to be sufficiently comfortable to allow for small variations in size and shape of the substrate 11, as well as resistant to the processing solvents.

A third embodiment of the invention resembles that shown in FIGS. 1A, 1B and 2 physically, however, the elastomer in its relaxed state conforms to a substrate placed on the spinning chuck. To place the substrate on the chuck at the beginning of the process, a slight vacuum is applied to deflate the elastomer slightly. After the substrate is in position, the vacuum is released and the elastomer conforms to the substrate periphery. To remove the substrate, the vacuum is again applied to deflate the elastomer. The first and second embodiments of the invention are slightly superior in that greater pressure can be provided at the substrate periphery to prevent resist coating of the substrate edge and backside.

Figure 4:
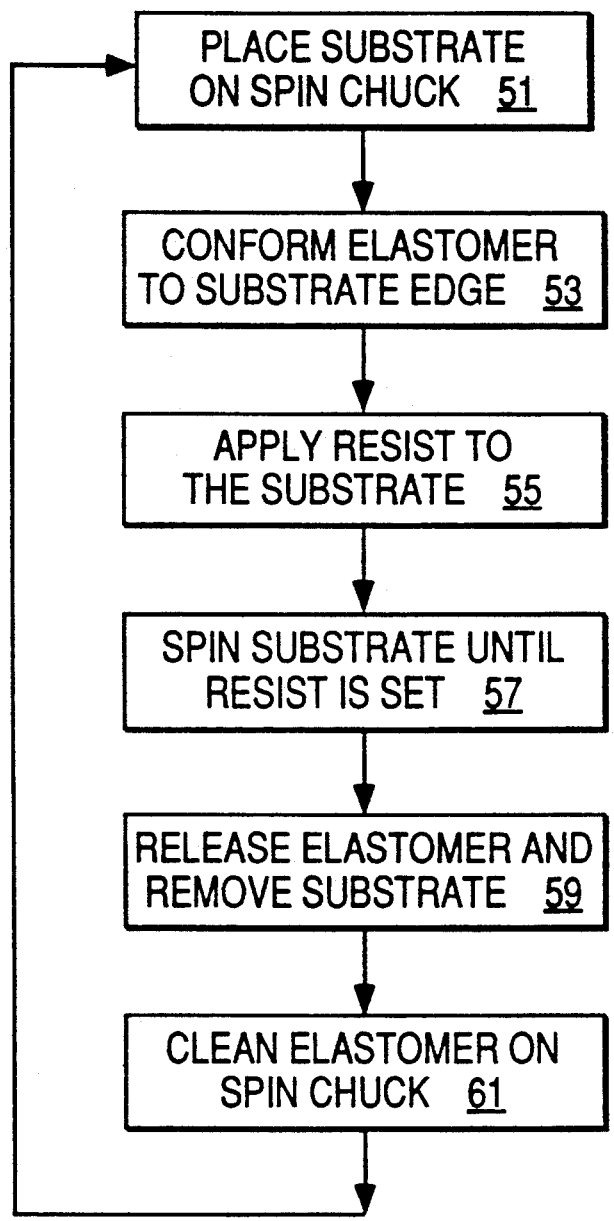
FIG. 4 is a diagram of the process steps for forming a thin film of material according to the present invention.

The process flow of the invention is illustrated in FIG. 4. In box 51, the substrate 11 is placed on the spin chuck fixture 13 which extends in a lateral direction past the edge of the substrate 11. The substrate 11 is held in place by vacuum. The elastomer 17, 41 is then conformed to the periphery of the substrate 11 so that any small variations in size and shape are compensated in box 53. In the case of the first embodiment, the elastomer 17 is inflated to seal the edge of the substrate 29. Where the solid elastomer 41 is used in the second embodiment, it is accomplished by pulling the substrate 11 down into the elastomer 41 by vacuum. In both cases, the top surface of the elastomer is substantially planar to the top surface of the substrate 27. In box 55, resist 21 is applied in a conventional manner. Dispense tools are well known in the art; they can be as simple as a piece of tubing connected to a resist reservoir equipped with a pump which forces a measured quantity of liquid through the tubing to the substrate. In box 57, the substrate 11 is spin coated with the resist by starting the rapid rotation of the spin chuck 13. The resist is set by extending the spin or bake for a few seconds to remove sufficient solvents so that resist 21 will not flow or bead up when the elastomer is removed. The resist 21 will not be so fully hardened that the resist 21 flakes when the elastomer 17 is deflated. In box 59, the elastomer is removed from the periphery of the substrate. For the inflatable elastomer 17, the elastomer 17 is deflated to allow substrate 11 to be removed. For the resilient ring of elastomer 41, the vacuum force is released, allowing the substrate 11 to be freed. The substrate 11 is removed to a hot plate to complete the bake process. The elastomer 17 is spray rinsed with resist solvent while spinning to remove excess resist 21. Spray clean tools are also well known to the art. Pressurized solvents are directed by means of a spray nozzle to the elastomer 17 in the fixture 13. Then, the spin chuck 13 is spun at high speed to dry the elastomer 17. The substrate 11 is now ready for exposure and the fixture 13 is ready for the next substrate.

While several embodiments of the invention, together with modifications thereof, have been described in detail herein and illustrated in the accompanying drawings, it will be evident that various further modifications are possible without departing from the scope of the invention. Those skilled in the art would find many obvious equivalents to those listed above. The embodiments discussed above describe and illustrate the apparatus necessary for a circular substrate such as a semiconductor wafer. For substrates of other shapes, the elastomer ring and other portions of the apparatus must be modified to correspond to these shapes. For example, a square or rectangular substrate such as a ceramic chip carrier will require a square or rectangle elastomer ring which is generally similar in shape and size to the periphery of the chip carrier. Nothing in the above specification is intended to limit the invention more narrowly than the appended claims.

We claim:

1. An apparatus for spin coating a planar surface of a substrate having a periphery comprising:
   a rotatable fixture for spinning the substrate having a conformable elastomeric ring for engagement to the periphery of the substrate, the ring when engaged forming a substantially continuous surface with the planar surface to allow a liquid material to flow unimpeded off the planar surface; and,
   means for bringing the substrate and conformable elastomeric ring from a first position, where the ring is not engaged to the periphery of the substrate, to a second position, where the ring is engaged with the periphery of the substrate.

2. The apparatus as recited in claim 1 wherein the conformable elastomeric ring is an inflatable ring of elastomer and the means for bringing the substrate and ring to the second position is a means for inflating the inflatable ring so that it engages the periphery of the substrate to form a substantially continuous surface.

3. The apparatus as recited in claim 1 wherein the conformable elastomeric ring is a resilient elastomeric ring and the means for bringing the substrate ring to the second position is a means for producing a vacuum force on a side of the substrate opposite to the planar surface.

4. The apparatus as recited in claim 1 wherein the elastomeric ring comprises at least one of the group consisting of rubber, plastic, nitrile, fluorocarbon, fluoroelastomer or perfluoroelastomer; and, wherein the composition of the ring withstands solvents in the liquid material and used to clean the liquid material from the ring.

5. The apparatus as recited in claim 1 which further comprises:

means for holding the substrate in place on the fixture while spinning;

means for dispensing the liquid material on the planar surface; and, means for cleaning the liquid material from the fixture and the ring after the planar surface has been coated.

6. The apparatus as recited in claim 1, wherein the liquid material is a photoresist.

7. The apparatus as recited in claim 1, wherein the substrate is a semiconductor wafer having a circular periphery and the conformable elastomeric ring is circular to engage the wafer periphery.

* * * * *